United States Patent [19]
Young et al.

[11] 4,316,106
[45] Feb. 16, 1982

[54] DYNAMIC RATIOLESS CIRCUITRY FOR RANDOM LOGIC APPLICATIONS

[75] Inventors: Ian A. Young, Farmers Branch; David B. Hildebrand, Bedford; Charles B. Johnson, Carrollton, all of Tex.

[73] Assignee: Mostek Corporation, Carrollton, Tex.

[21] Appl. No.: 111,274

[22] Filed: Jan. 11, 1980

[51] Int. Cl.³ .................. H03K 19/096; H03K 19/20; H03K 19/003; H03K 17/687

[52] U.S. Cl. ................................ 307/481; 307/225 C; 307/443; 307/482

[58] Field of Search ............... 307/221 C, 225 C, 262, 307/DIG. 4, 443, 450, 453, 481, 482, 577, 578, 584, 251, 205, 214, 215, 208

[56] References Cited
U.S. PATENT DOCUMENTS

| | | | |
|---|---|---|---|
| 3,576,447 | 4/1971 | McKenny | 307/221 C |
| 3,586,875 | 6/1971 | Nicklas | 307/DIG. 4 X |
| 3,601,627 | 8/1971 | Booher | 307/205 |
| 3,794,856 | 2/1974 | Baker | 307/205 |
| 3,909,627 | 9/1975 | Mizuno | 307/208 X |
| 3,925,686 | 12/1975 | Nomiya | 307/221 C X |
| 3,935,474 | 1/1976 | Komarek | 307/205 |
| 3,937,982 | 2/1976 | Nakajima | 307/221 C X |
| 4,114,049 | 9/1978 | Suzuki | 307/225 C |

OTHER PUBLICATIONS

Landers, "MOS Shift Registers"; *The Electric Engineer*; pp. 59-61; 3/1970.

Penney et al., *MOS/LSI Integrated Circuits*; Van Nostrand Reinhold Company, 1972; pp. 260-288.
Carr et al., *MOS/LSI Design and Application*; McGraw-Hill; 1972; pp. 150-167.
Joynson et al., *IEEE Journal of Solid-State Circuits*; vol. SC-7, No. 3, pp. 217-224; 6/1972.
Knepper, *IEEE Journal of Solid-State Circuits*; vol. SC-13, No. 5; pp. 542-548; 10/1978.

*Primary Examiner*—Larry N. Anagnos

[57] ABSTRACT

A logic circuit (20) is provided for receiving an input signal and for generating a delayed output signal being clocked by first and second non-overlapping clock phases. Logic circuit (20) includes a voltage supply (V). A precharge transistor (30) is interconnected to the voltage supply (V) and is clocked by the first clock phase. A discharge transistor (32) is interconnected to the precharge transistor (30) thereby defining a first node (A) and is clocked by the second clock phase to conditionally discharge the first node (A). An input logic circuit (34) is interconnected to the discharge transistor (32) thereby defining a second node (B) for providing a discharge path from the first node (A) to a ground voltage potential, the input logic circuit (34) is connected to receive the input signal. An output transistor (36) is interconnected to the first node (A) for generating the delayed output signal. The output transistor (36) is clocked by the second clock phase. A capacitor (38) is interconnected to the first node (A) and the output transistor (36) and is clocked by the second clock phase for maintaining the first node (A) at a predetermined voltage level by a bootstrapping operation.

7 Claims, 25 Drawing Figures

DYNAMIC RATIOLESS CIRCUITRY FOR RANDOM LOGIC APPLICATIONS

TECHNICAL FIELD

This invention relates to digital logic circuits, and more particularly to dynamic ratioless circuitry for low power, low voltage, random logic circuit applications fabricated using MOS technology.

BACKGROUND ART

In the design of digital logic circuits, low power performance and size minimization are essential. With the development of metal-oxide-semiconductor (MOS) techniques, the realization of low power performance has been accomplished. Low power performance in digital logic MOS circuitry has been obtained through two approaches. A first approach has utilized a CMOS design. CMOS designs have essentially achieved zero static current drain, but suffer from an inherently large die area and large number of process steps. A second approach to achieve low power performance of digital logic MOS circuits is the use of a single channel "ratioless" design in which the logic circuit does not depend on a ratio of resistances as utilized in enhancement driver-depletion load inverters. As used and understood herein, ratioless design permits no DC paths to a ground potential in the logic circuit. Ratioless logic has been shown to offer the benefits of low power dissipation together with small device geometries to provide a smaller device layout and the simplicity of a single channel fabrication process.

Ratioless logic and single channel fabrication processes have been utilized in a number of ratioless logic configurations. One MOS large scale integration (LSI) circuit function is a digital delay line or shift register. MOS shift register design has proven valuable in that the high impedance of an MOS device gate permits temporary data storage in the form of charge in parasitic capacitance. MOS technology permits realization of bidirectional transmission with a zero voltage offset across the device and the load devices may be turned off, as desired, by multiple clocks to reduce power dissipation. MOS shift registers have additional advantages in having smaller chip sizes. MOS shift registers have found application in computer display terminals, electronic calculators and computer peripherals such as memory circuits. Such use is dynamic wherein clock logic is utilized such that inputs must be loaded at a particular time and outputs can be valid and received at predetermined time periods. The application of digital logic MOS circuitry implemented in dynamic shift registers is described in a publication entitled *MOS/LSI Design and Application*, written by William N. Carr and Jack P. Mize (Copyright 1972, McGraw-Hill Book Company) at pages 150–167 and a publication entitled *MOS Integrated Circuits*, edited by William M. Penney and Lillian Lau (Copyright 1972, Vann Nostrand Reinhold Company) at pages 260–288.

While ratioless logic and single channel fabrication processes have found extensive use in dynamic register applications, such use has been limited in the design of random logic circuitry. This limitation is principally seen from numerous problems associated with most ratioless logic design schemes. One deficiency in existing ratioless logic schemes is that charge sharing between the logic output capacitance and the input capacitance of a stage to be driven results in a reduced output logic level. This reduced output logic level decreases the noise margin of the device and renders low voltage operation difficult. Another disadvantage in previously developed ratioless logic is degraded logic levels, due not only to charge sharing but also due to gate-to-source and gate-to-drain overlap capacitances. Degraded logic levels occur due to undesirable coupling between clock signal lines and logic nodes. An additional disadvantage with previously developed ratioless logic circuits is that numerous different clock phases must be generated unless a two-phase clock approach is utilized. However, most two-phase clock approaches cannot be utilized with feedback loops having odd numbers of inverting stages. Such feedback loops are essential in constructing even the simplest random logic circuit such as a toggle flip-flop. Additionally, previously developed ratioless logic schemes suffer from the nonavailability of the full supply voltage from logic outputs due to threshold voltage losses even ignoring the previously mentioned deficiency caused by the effect of charge sharing. This disadvantage creates a problem for one logic block of a circuit to serve as a clock source for subsequent logic blocks. Finally, previously developed ratioless logic schemes suffer in that clock loading can become undesirably high due to large numbers of gates, drains and sources tied to clock lines.

A need has thus arisen for a ratioless dynamic logic device which offers the advantages heretofore present for ratioless logic, namely low power dissipation and small geometry devices while eliminating the problems heretofore present for random logic application. A need has arisen for a logic device in which the effect of charge sharing between logic output and input capacitances of a stage are minimized to maintain the full original logic level for voltage. A need has further arisen for a logic device in which odd numbers of inverting stages can be incorporated in feedback loops wherein a two-phase clock approach is utilized to simplify clock generation. A still further need has arisen for a logic circuit in which logic outputs gate full supply voltage clocks to minimize the use of multiple clock phase systems. Additionally, a need has arisen for a logic device in which clock loading permits the charge required for operation to be applied directly from a supply voltage rather than the clock phase itself.

DISCLOSURE OF THE INVENTION

In accordance with the present invention, dynamic ratioless circuitry is provided for random logic applications using MOS technology to substantially eliminate the problems heretofore associated with ratioless logic design for random logic applications while achieving the benefits of low power, low voltage and small geometry devices.

In accordance with the present invention, a logic circuit is provided for receiving an input signal and for generating a delayed output signal being clocked by first and second non-overlapping clock phases. The logic circuit includes a voltage supply source. A precharge transistor is interconnected to the voltage supply source and is clocked by the first clock phase. A discharge transistor is interconnected to the precharge transistor thereby defining a first node and is clocked by the second clock phase to conditionally discharge the first node. The precharge transistor precharges the first node. An input logic device is interconnected to the discharge transistor thereby defining a second node for providing a discharge path from the first node to a ground voltage potential, the input logic device is connected to receive the input signal. An output transistor is interconnected to the first node for generating the delayed output signal, the output transistor is clocked by the second clock phase. A capacitor is interconnected to the first node and the output transistor and is clocked by the second clock phase for maintaining the first node at a predetermined voltage level by a bootstrapping operation.

In accordance with another aspect of the present invention, a one bit delay logic device is provided for receiving an input signal and for generating an output signal delayed by one bit from the input signal and being twice inverted within a two clock phase period, the one bit delay logic device receiving first and second non-overlapping clock phases. The one bit delay logic device includes a voltage supply source. A first precharge transistor is interconnected to the voltage supply source and is clocked by the first clock phase. A first discharge transistor is interconnected to the first precharge transistor thereby defining a first node and is clocked by the second clock phase to conditionally discharge the first node. A first input transistor is interconnected to the first discharge transistor for providing a discharge path from the first node to a ground voltage potential, the first input transistor is connected to receive the input signal. A first output transistor is interconnected to the first node for generating a half bit delayed inverted output signal during the second clock phase and is clocked by the second clock phase. A first capacitor is interconnected to the first node and the first output transistor and is clocked by the second clock phase for maintaining the first node at a predetermined voltage level. A second precharge transistor is interconnected to the voltage supply source and is clocked by the second clock phase. A second discharge transistor is interconnected to the second precharge transistor thereby defining a second node and being clocked by the first clock phase to conditionally discharge the second node. A second input transistor is interconnected to the second discharge transistor for providing a discharge path from the second node to the ground voltage potential, the second input transistor is connected to receive the half bit delayed output signal from the first output transistor. A second output transistor is interconnected to the second node for generating a one bit delayed output signal during the first clock phase and being inverted from the half bit delayed inverted output signal and is clocked by the first clock phase. A second capacitor is interconnected to the second node and the second output transistor and is clocked by the first clock phase for maintaining the second node at a predetermined voltage level.

In accordance with another aspect of the present invention, a half bit delay logic device is provided for receiving an input signal and for generating an output signal delayed by one half bit from the input signal and being twice inverted within one clock phase period. The half bit delay logic device receives first and second non-overlapping clock phases and includes a voltage supply source. A first precharge transistor is interconnected to the voltage supply source and is clocked by the first clock phase. A first discharge transistor is interconnected to the first precharge transistor thereby defining a first node and being clocked by the second clock phase to conditionally discharge the first node. A resistor is interconnected to the first discharge transistor. A first input transistor is interconnected to the resistor thereby defining a second node for providing a discharge path from the first node to a ground voltage potential, the first input transistor is connected to receive the input signal. A first output transistor is interconnected to the first node for generating a half bit delayed inverted output signal during the second clock phase and is clocked by the second clock phase. A first capacitor is interconnected to the first node and the first output transistor and is clocked by the second clock phase for maintaining the first node at a predetermined voltage level. A second discharge transistor is interconnected to the second precharge transistor thereby defining a third node and being clocked by the second clock phase to conditionally discharge the third node.

A second input transistor is interconnected to the second discharge transistor for providing a discharge path from the third node to the ground voltage potential, the second input transistor is connected to the second node. A second output transistor is interconnected to the third node for generating a half bit delayed inverted output signal during the second clock phase and is clocked by the second clock phase. A second capacitor is interconnected to the third node and the second output transistor and is clocked by the second clock phase for maintaining the third node at a predetermined voltage level.

In accordance with yet another aspect of the present invention, in a logic circuit wherein a plurality of logic devices are interconnected in successive logic blocks, a clock signal generating circuit is provided for generating clock signals used by a succeeding logic block in response to the output of a preceding logic block. The clock signal generating circuit receives an input signal and receives first and second non-overlapping clock phases and includes a first transistor for receiving the input signal and the first clock phase. A second transistor is interconnected to the first transistor thereby defining a first node. The second transistor is connected to receive the second clock phase to provide an output clock signal to a succeeding logic block upon receiving the second clock phase. The second transistor maintains a predetermined charge on the first node.

In accordance with still another aspect of the present invention, a buffer inverter logic circuit is provided for receiving an input signal and for generating a delayed output signal for outputting to succeeding interconnected logic circuits. The buffer inverter logic circuit is clocked by first and second non-overlapping clock phases and includes a voltage supply source. A precharge transistor is interconnected to the voltage supply source and is clocked by the first clock phase. A first discharge transistor is interconnected to the precharge transistor thereby defining a first node and is clocked by the second clock phase to conditionally discharge the first node. An input transistor is interconnected to the discharge transistor for providing a discharge path from the first node to a ground voltage potential. The input transistor is connected to receive the input signal. A transistor is interconnected to the first node to effectively isolate the first node from the output of the buffer inverter logic circuit. The transistor is clocked by the second clock phase. An output transistor is interconnected to the transistor for generating the delayed output signal and is clocked by the second clock phase.

BRIEF DESCRIPTION OF DRAWINGS

For a more complete understanding of the present invention and for further objects and advantages thereof, reference will now be made to the following Detailed Description taken in conjunction with the accompanying Drawings in which.

DETAILED DESCRIPTION

It will be understood that the present logic devices find wide applications for use in random logic circuits. Such application include, for example, telecommunication CODEC devices, clock dividers, programmable clock dividers, random logic circuits, successive approximation circuits, input/output registers, shift registers, holding registers, and binary counters, to name a few. The embodiments of the present invention are presented to provide examples for use of the present logic devices and are not intended to be limiting on any manner.

Figure 1:
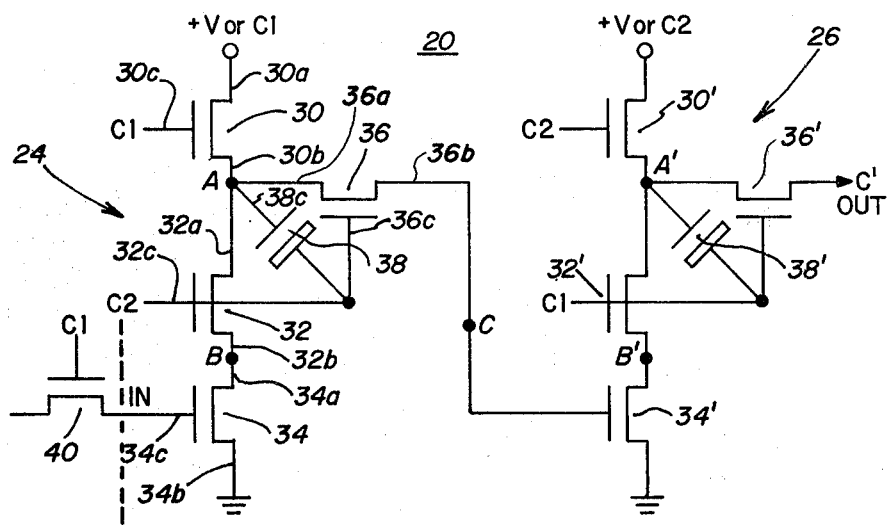
FIG. 1 is a logic circuit schematic diagram illustrating the one bit of signal delay logic device of the present invention.

Referring to FIG. 1, the one bit of signal delay logic device of the present invention is illustrated and is generally identified by the numeral 20. One bit of signal delay 20 is comprised of identical half bit of signal delay logic devices generally identified by the numerals 24 and 26. Half bit of signal delays 24 and 26 each perform an inversion of the input signal, such that if the input signal is a logic one or high, the output of half bit of signal delay 26 will be high. Similarly, if the input to half bit of signal delay 24 is a logic zero or low, the output of half bit of signal delay 26 will be low.

Half bit of signal delay logic device 24 includes transistor 30 having terminals 30a and 30b and a control terminal 30c. As used herein, unless otherwise stated, transistor devices are enhancement mode transistors and will be identified as having two terminals identified by the transistor numeral followed by a prefix "a" or "b" and a control terminal identified by the transistor numeral and the prefix "c." Transistor 30 is interconnected to a transistor 32 such that terminal 32a of transistor 32 defines a node A at the interconnection with terminal 30b of transistor 30. Transistor 34 is interconnected at its terminal 34a to terminal 32b of transistor 30 to form a node B. Terminal 34b of transistor 34 is interconnected to ground voltage potential.

The output of half bit of signal delay 24 is applied through an output transistor 36 having its terminal 36a connected to node A and terminal 36b connected to the input of half bit of signal delay 26 at a node C. An important aspect of the present one bit of signal delay 20 is a capacitor 38 interconnected between node A defined as the junction of terminals 30b, 32a and 36a and terminal 38c.

Inputs to one bit of signal delay 20 include non-overlapping clock phases identified as C1 and C2. Clock phase C1 is applied to control terminal 30c of transistor 30. Clock phase C2 is applied to terminal 32c of transistor 32 and terminal 36c of transistor 36. The input of one bit of signal delay 20 is applied through a transistor 40 external to one bit of signal delay 20 clocked by the C1 clock phase to transistor 34. An input positive voltage source is applied to one bit of signal delay 20 at terminal 30a of transistor 30. Alternatively, a positive voltage source may be supplied from the C1 clock phase itself. As used herein, a clock phase will be defined as half bit time, such that two clock phases represent one bit time interval.

The components of half bit of signal delay 26 are identified with reference numerals corresponding to the reference numerals utilized above to identify the components of half bit of signal delay 24, however, a prime (') symbol is utilized for these components. It can be seen that the clock phase C2 is applied to transistor 30', clock phase C1 is applied to transistors 32' and 36'. The output of half bit of signal delay 24 is applied as an input to half bit of signal delay 26 to transistor 34'. The output of half bit of signal delay 26 is generated by transistor 36'. A supply source is applied to transistor 30' or alternatively, clock phase C2 may provide a voltage source for half bit of signal delay 26.

The use of clock phase C1 and clock phase C2 in place of the positive voltage supply source to drive transistors 30 and 30' creates additional clock loading due to the fact that the clock phase must provide the charge to charge the capacitances on node A and A'. However, an advantage of utilizing the clock phases as this charging source eliminates the need for positive supply voltage signal lines throughout one bit of signal delay 20 to conserve area necessary to fabricate the present invention.

One bit of signal delay 20 can be cascaded by interconnecting output C' to input 34c to form a shift register or other random logic devices. Throughout the following discussion, when reference to a component is made, the corresponding component identified by a prime referenced numeral will function in a similar manner.

In operation, transistor 30 functions as a precharge device for precharging node A to a voltage equal to the supply voltage less one threshold voltage of transistor 30. Transistor 30 charges all capacitances present at node A including any shunt capacitance at node A to ground potential and also charges capacitor 38. Transistor 32 functions as a discharge device to enable transistor 34 to provide a selective discharge path to ground to permit the capacitance at node A to be discharged. Transistor 32 conditionally discharges the capacitance of node A when clock phase C2 is present. It can be seen that transistors 30, 32 and 34 are never connected from the voltage supply source to ground since transistors 30, 32 and 34 are never simultaneously conductive due to the non-overlapping clock pulse scheme of clock pulses C1 and C2. Therefore, there is never a DC path to ground potential which is essential in the ratioless logic scheme of the present invention. Transistor 36 functions as an output device to serve the purpose of coupling the logic output at node A to the input of another stage or stages such as node C at the input of transistor 34'.

An important aspect of the present invention is the operation of capacitors 38 and 38' which allows bootstrap action to overcome the effect of the charge sharing processing within one bit of signal delay 20. As used herein, bootstrapping refers to the effect that the voltage present at a node will rise above the supply voltage. Charge sharing refers to the equalization of voltage stored within two capacitors resulting when a first precharged capacitor discharges to a second uncharged capacitor. In operation, during clock phase C1, node A is precharged to a threshold voltage below the +V, the supply voltage. During clock phase C2, clock phase C2 rises, to cause node A to bootstrap above the positive supply. Node A will then charge share with node C providing the input voltage is at a low level. Provided that capacitor 38 is approximately as large or larger than the shunt capacitance present at node C, node C will rise to a full threshold voltage below the positive supply voltage, such that there is no loss in the transferred voltage as is present in previously developed circuits not utilizing capacitor 38 of the present invention. In the absence of capacitor 38, charge sharing occurs between node A and node C and the result is that both nodes A and C degrade to a voltage less than a threshold below the positive supply voltage.

Referring simultaneously to FIGS. 1 and 2, a more detailed explanation of the operation of the present one bit of signal delay 20 will now be described. FIGS. 2a and 2b illustrate clock phases C1 and C2. It can clearly be seen that clock phases C1 and C2 are non-overlapping and are pulses having a voltage level of +V. At C1 clock phase 50 assume that the input goes low, being some undefined value prior to C1 clock phase 50 (FIG. 2a). During C1 clock phase 50 (FIG. 2a), the voltage at node A precharges to a value of the supply voltage less one threshold voltage (FIG. 2c). The voltage at nodes C (FIG. 2d), C' (FIG. 2e) and A' (FIG. 2g) is undefined during clock phase 50. At C2 clock phase 52 (FIG. 2b), as clock phase 52 rises, the voltage at node A (FIG. 2c) does not discharge but simply bootstraps up above the positive supply shown in FIG. 2c at point 54 and then charge shares at point 56 with the capacitance present at node C. As the voltage at node A decreases somewhat, the voltage at node C rises. As shown in FIG. 2d, node C is now a logic one. Node C' still represents prior data as illustrated by the dashed line in FIG. 2e. At the next C1 clock phase, 58, half bit of signal delay 26 performs its inversion function and the voltage at node C' (FIG. 2e) falls. Therefore, for an input applied to transistor 34 (FIG. 1) being a zero or low level (FIG. 2f), the voltage at node C is equal to a logic one and node C' becomes zero. As shown in FIG. 2g, at clock phase 52, node A' charges to the supply voltage less one threshold.

Figure 2A:
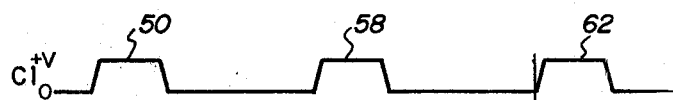
FIGS. 2(a–g) shows signal wave forms illustrating the operation of the present one bit of signal delay logic device shown in FIG. 1.
Figure 2B:
Figure 2C:
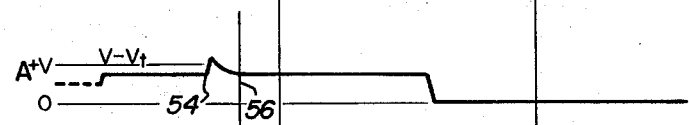
Figure 2D:
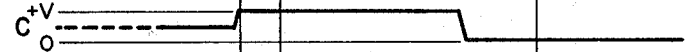
Figure 2E:
Figure 2F:
Figure 2G:
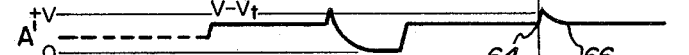

Now assume that the input voltage (FIG. 2f) changes from a low value to a high value during clock phase 58. On the next succeeding C2 clock phase, 60, node A (FIG. 2c) will discharge, it being precharged during clock phase 58 which means it continues high because it was high at the start of clock phase 58. At C2 clock phase 60, the voltage at node A falls because the input (FIG. 2f) is now a one so that when C2 clock phase 60 rises, transistor 32 turns on and the charge at node A passes through transistors 32 and 34 to discharge node A to ground. As the voltage at node A (FIG. 2c) falls, the voltage at node C (FIG. 2d) also falls because transistor 36 is active. During the next succeeding C1 clock phase, 62, since node C is low, there is no discharge path for nodes C' and A' to discharge to ground so that nodes C' (FIG. 2e) and A' (FIG. 2g) go high. Node A' precharges during clock phase 60 and bootstraps at point 64 at the rising edge of C1 clock phase, 62, and charge shares to point 66. It can be seen that for an input that is a one or a high level, node C (FIG. 2d) goes low and node C' (FIG. 2e) goes high illustrating the two inversions occur due to operation of half bit of signal delays 24 and 26. One full bit time is required to accomplish these two inversions. The first inversion takes place during a C2 clock time while the second inversion takes place during a C1 clock time. As shown in FIGS. 2d and 2e, nodes C and C' cannot go above a threshold below the positive supply voltage since as soon as they reach the threshold below the positive supply voltage, transistor 36 (FIG. 1) cuts off and the output can no longer rise; however, as long as the bootstrap capacitor action of capacitor 38 occurs, nodes A and A' bootstrap high to pull outputs C and C' up to a threshold below the supply voltage to achieve the advantages of the present invention.

Figure 3:
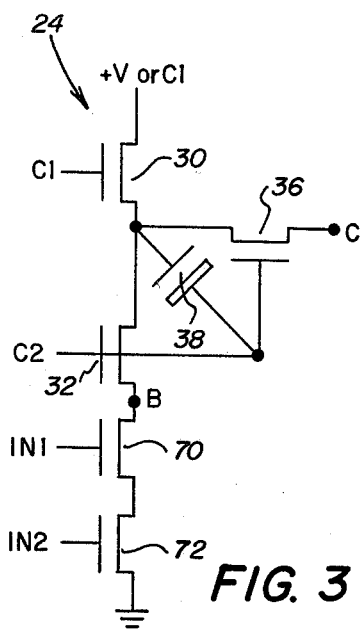
FIG. 3 is a logic circuit schematic diagram illustrating a NAND gate logic device utilizing the present first half bit of signal delay shown in FIG. 1.
Figure 4:
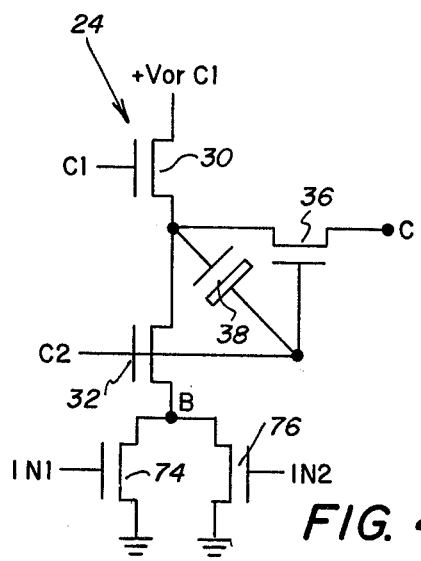
FIG. 4 is a logic circuit schematic diagram illustrating a NOR gate logic device utilizing the present first half bit of signal delay shown in FIG. 1.
Figure 5:
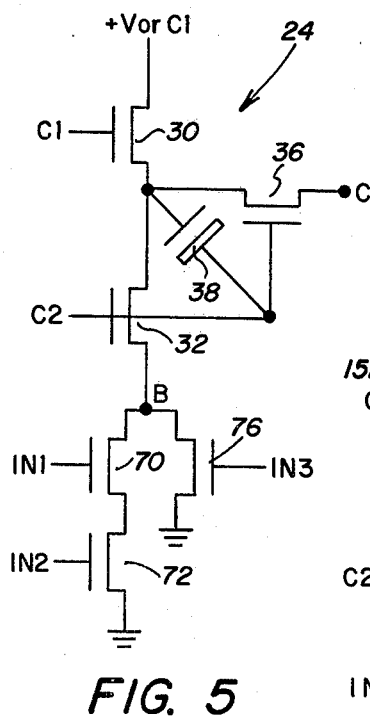
FIG. 5 is a logic circuit schematic diagram illustrating a complex gate logic device utilizing the present first half bit of signal delay shown in FIG. 1.

Referring to FIGS. 3, 4 and 5, half bit of signal delay 24 is illustrated to perform more complicated gating functions wherein like numerals are utilized for like and corresponding components previously identified. It can be seen that transistor 34, functioning as a discharge device to ground is replaced with transistors 70 and 72 (FIG. 3). Transistors 70 and 72 are placed in series to function as a NAND gate. FIG. 4 illustrates transistors 74 and 76 interconnected in parallel as opposed to transistor 34 (FIG. 1) to operate as a NOR gate. A further complex gate is illustrated in FIG. 5 wherein transistors 70 and 72 are connected in series and being connected in parallel with transistor 76 to form a complex gate. The replacement of transistor 34 with transistors 70, 72, 74, and 76 modifies the inversion function of half bit of signal delay 24 to perform logical functions depending upon the logical combination of inputs to these transistors. Since transistors 70, 72, 74 and 76 provide a discharge path to ground for the capacitance at node A depending upon the combination of their respective inputs, that discharge is logically dependent rather than an inverting discharge performed by transistor 34 (FIG. 1) of half bit of signal delay 24. Although the more complicated gates of FIGS. 3, 4 and 5 have only been illustrated with respect to half bit of signal delay 24 (FIG. 1), transistor 34' can also be replaced with additional transistors to form higher complex gate devices.

Figure 6:
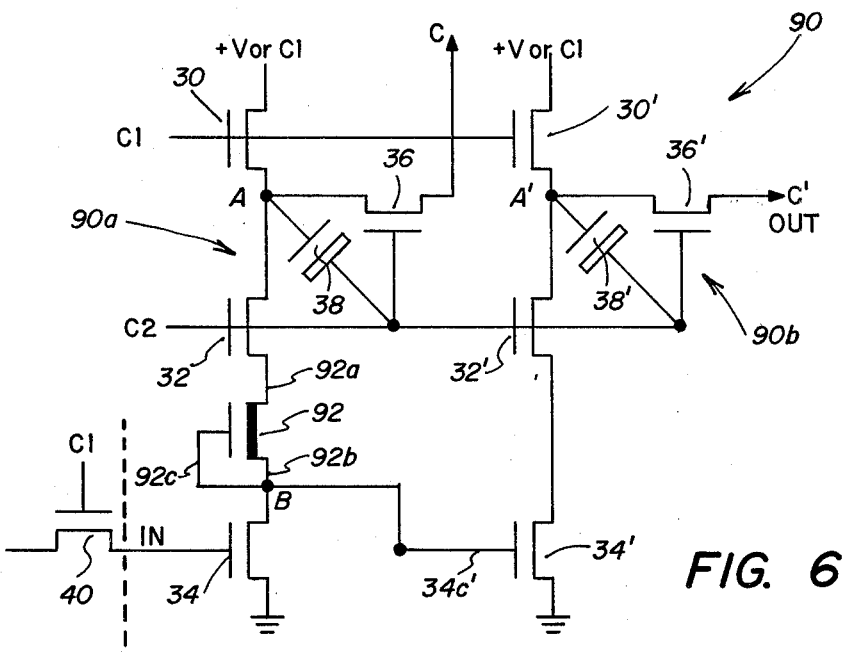
FIG. 6 is a logic circuit schematic diagram illustrating the half bit of signal delay logic device of the present invention.

As previously stated, the one bit of signal delay logic device 20 performed two stages of inversion on the input signal during two clock phases or one bit time. In random logic circuit application it is also desirable to perform two stages of inversion in one clock phase or half bit time. FIG. 6 illustrates the half bit of signal delay logic device of the present invention generally identified by the numeral 90. Like reference numerals are utilized for like and corresponding components as utilized in FIG. 1 to identify the elements of half bit of signal delay logic devices 90.

The C1 clock phase is applied to transistors 30 and 30' and the C2 clock phase is applied to the transistors 32, 32', 36, 36' and capacitors 38 and 38'. Output transistors 36 and 36' generate outputs at nodes C and C'. As previously described, transistor 30 functions to precharge the capacitance present at node A to a threshold below the positive supply voltage. Transistor 32 again performs the discharge function which allows node A to be selectively connected to the logic discharge path to ground through transistor 34. Transistor 34 being a single device renders half bit of signal delay logic device 90 an inverter pair in contradistinction to use of additional logic devices connected to form a discharge path to ground as described with respect to FIGS. 3, 4 and 5. Capacitor 38 is the capacitive device which performs the bootstrap operation for the voltage at node A as clock phase C2 rises. Transistor 36 is the output device for connecting node A to a next stage or successive stages of half bit of signal delay logic device 90. Interconnected between transistor 32 and transistor 34 is a depletion transistor 92 such that terminal 92a is interconnected to transistor 32, terminal 92b and control terminal 92c are interconnected to node B which is also interconnected to control terminal 34c' of transistor 34'. Depletion transistor 92 is interconnected to function as a resistor to limit current that is generated as clock phase C2 rises.

Half bit of signal delay logic device 90 operates such that as clock phase C2 rises, node A is bootstrapped high. If transistor 34 is on, due to a high level on its input through transistor 40, current will flow from capacitor 38 from node A to ground through transistors 32, 92 and 34. This current must be limited by depletion transistor 92 such that the voltage at node B will not rise significantly above ground potential. In the operation of the present half bit of signal delay logic device 90, it is essential that the voltage at node B not rise significantly above ground potential when the current spike occurs on the rising edge of clock phase C2, because transistor 34' will be activated. The activation of transistor 34' through discharge of the capacitance at node A is undesirable since activation of transistor 34' in this manner would be controlled by a clock phase C2 instead of having its activation controlled by the input logic signal. In summary, depletion transistor 92 limits the current associated with the rising edge of clock phase C2 such that node B cannot rise above the threshold voltage of transistor 34' to ensure that the second inverter stage of half bit of signal delay logic device 90 will operate properly and ensure that node A' does not discharge prior to the time when transistor 34' is actually activated. It therefore can be seen that stage 90a of half bit of signal delay logic device 90 can drive stage 90b to perform two stages of inversion in a single half bit time whereas one bit of signal delay logic device 20 performed two inversions within two clock phases, one full bit time.

Referring simultaneously to FIGS. 6 and 7, a more detailed explanation of the operation of half bit of signal delay logic device 90 will now be discussed. As illustrated in FIG. 7g, assume first that the input voltage to half bit of signal delay logic device 90 is low. As the C1 clock phase 100 rises, nodes A and A' are precharged within a threshold of the positive supply voltage, V, as illustrated in FIGS. 7c and 7d. Nodes C, C' and B in FIGS. 7e, 7f and 7h have prior unknown data illustrated by the dashed line. C2 clock phase 102 then rises attempting to bootstrap both nodes A and A' above the positive supply voltage illustrated by points 104 and 106 (FIGS. 7c and 7d). If the input voltage is low (FIG. 7g), there is nothing to prevent node A from bootstrapping above the positive supply and capacitor 38 (FIG. 6) will charge share to cause the voltages at nodes C and B to rise, illustrated in FIGS. 7e and 7h. As node B goes high, transistor 34' is turned on. Since C2 clock phase, 102, is high at this period of time and since transistor 34' and transistor 32' are on, node A' discharges, at point 108 (FIG. 7d) and node C' discharges at point 110 (FIG. 7f) because transistor 36' is also on during C2 clock phase, 102 (FIG. 7b). Therefore, it can be seen for a low input (FIG. 7g) node B and node C have gone to high levels signifying one inversion and node C' has gone to a low level showing a second inversion of the input signal. These two inversions have taken place within a single C2 clock phase or half bit time.

Figure 7A:
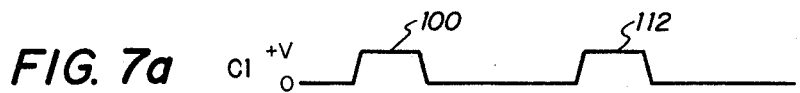
FIGS. 7(a–h) shows signal wave forms illustrating the operation of the present half bit of signal delay logic device shown in FIG. 6.
Figure 7B:
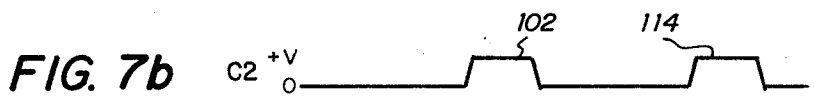
Figure 7C:
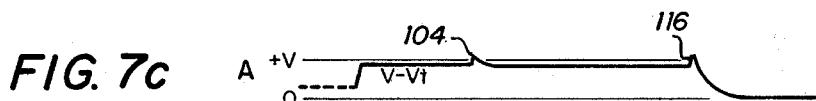
Figure 7D:
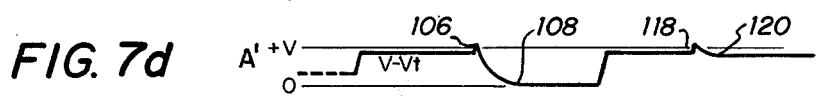
Figure 7E:
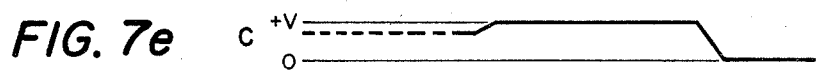
Figure 7F:
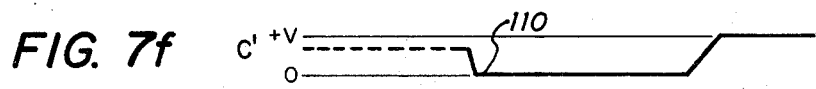
Figure 7G:
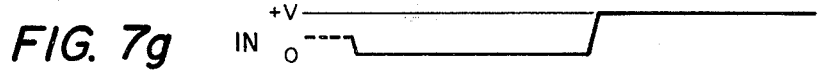
Figure 7H:
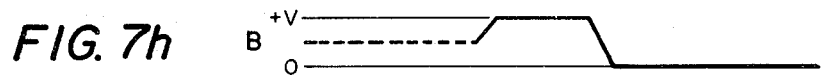

Now assuming that the input logic signal (FIG. 7g) is high, node B will be pulled to ground potential. During C1 clock phase, 112 (FIG. 7a), nodes A and A' (FIGS. 7c and 7d) are precharged to a threshold below the positive supply as previously described. When C2 clock phase, 114, (FIG. 7b) rises, nodes A and A' both attempt to be bootstrapped above the voltage of the positive supply at points 116 and 118 (FIGS. 7c and 7d). Since the input level is high (FIG. 7g), transistor 34 is on and current flows through transistors 32, 92 and 34 to discharge the capacitor of capacitor 38 on node A to ground. Therefore, node B (FIG. 7h), node A (FIG. 7c) and node C (FIG. 7e) are all discharged to ground. Since node B has been continually clamped at ground by the high input level on transistor 34, transistor 34' is off because the voltage at control terminal 34c' cannot rise above the threshold voltage of transistor 34' due to operation of transistor 92 limiting the current. Because transistor 34' is off, node A' does not discharge but instead bootstraps above the positive supply voltage at point 118 and then charge shares at point 120 with node C' (FIG. 7d). It therefore can be seen that two stages of inversion have taken place with the high level of input (FIG. 7g) since a low level is now present at node C, nodes A and B and a high level at node C'. Both inversions are performed during a single C2 clock phase.

Figure 8:
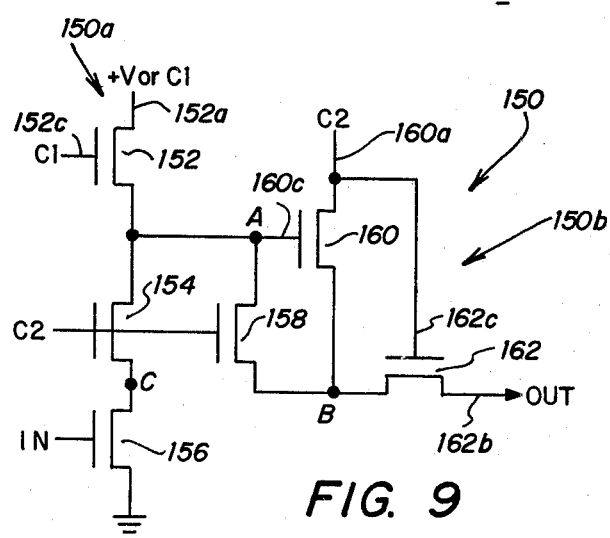
FIG. 8 is a logic circuit schematic diagram illustrating the gated clock logic device of the present invention.

FIG. 8 illustrates the logic device of the present invention for generating gated clocks and is generally identified by the numeral 130. Gated clock logic device 130 is driven by clock phases and generates gated clock phases which are used to clock subsequent logic devices. Gated clock logic device 130 includes transistors 132, 134 and 136. The input logic signal is applied to terminal 132a of transistor 132 whose terminal 132b is interconnected to control terminal 134c of transistor 134 to form a node A. Control terminal 132c of transistor 132 receives the C1 clock phase which is also applied to the control terminal 136c of transistor 136. Terminal 134a of transistor 134 receives the C2 clock phase. Terminal 134b and terminal 136a of transistor 136 are interconnected to form a node B which generates a gated C2 clock phase. Terminal 136b of transistor 136 is interconnected to ground reference potential.

In operation, the input logic signal is applied to node A during a C1 clock phase in which transistor 132 is turned on. The logic level at node A will be the typical positive supply voltage minus the threshold voltage of transistor 132. During clock phase C1, clock phase C2 is low so that transistor 134 is on and node B is at ground potential. When clock phase C1 falls and clock phase C2 rises, the channel capacitance of transistor 134 has been charged because of the high logic level input that has been placed on node A. As clock phase C2 rises, the voltage at node B will rise to cause the voltage at node A to bootstrap above the positive supply voltage. This bootstrapping operation allows node B to be pulled up, essentially to the voltage level of C2 which is the full power supply voltage. It can be seen that the high level logic input has thereby gated clock phase C2 from its source to node B.

If the logic input to transistor 132 was a zero, node A would be precharged or loaded with a zero. When clock phase C2 rises, transistor 134 is off and node B would remain at ground, such that clock phase C2 would not be gated to node B. Gated clock logic device 130 therefore controls whether a clock pulse is gated to node B. The full power supply voltage level clock, C2, is being gated by a logic signal that is a threshold below the full power supply voltage. The gated C2 clock can therefore be used to gate other logic blocks. The application of gated clock logic device 130 will be seen in connection with the operation of the binary divide-by-eight circuit of FIG. 11.

As previously stated, the channel capacitance of transistor 134 causes node A to be bootstrapped up. This bootstrapping, also known as varactor capacitor bootstrap action, has been described in a paper by Joynson et al entitled "Eliminating Threshold Losses in MOS Circuits by Bootstrapping Using Varactor Coupling," IEEE Journal of Solid-Stage Circuits, Volume SC-7, No. 3, June 1972 at pages 217-224.

The operation of transistor 136 is to ensure that node B fully discharges to ground potential as clock phase C1 begins. If the non-overlapping period between clock phases C1 and C2 is short, the voltage at node B may have insufficient time to discharge as clock phase C1 begins. Since the voltage at node B should only remain high during a C2 clock phase and low during a C1 clock phase, transistor 136 is required in such applications where the period between clock phase C1 and clock phase C2 is short.

Figure 9:
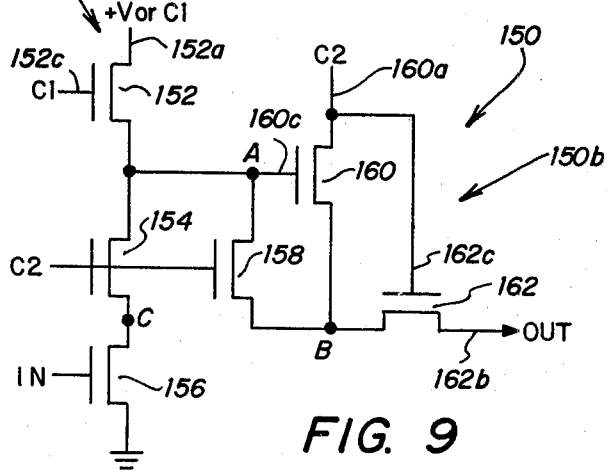
FIG. 9 is a logic circuit schematic diagram illustrating the buffer inverter logic device of the present invention utilizing the present gated clock logic device of FIG. 8.

Referring now to FIG. 9, a buffer inverter logic device generally identified by the numeral 150 is illustrated utilizing the advantages of gated clock logic device 130 (FIG. 8) with a half bit of signal delay similar to half bit of signal delay 24 (FIG. 1). The half bit of signal delay portion of buffer inverter logic device 150 is generally identified by the numeral 150a and the gated clock portion is generally identified by the numeral 150b. Half bit of signal delay 150a includes transistors 152, 154 and 156. The C1 clock phase is applied to terminal 152c of transistor 152. The voltage supply or clock phase C1 is applied to terminal 152a of transistor 152. The C2 clock phase is applied to the control terminals of transistors 154 and a transistor 158. The input logic level is applied to the control terminal of transistor 156. The control terminal 160c of transistor 160 is interconnected to transistors 152, 154 and 158 to form a node A. Transistor 160 receives the C2 clock phase at terminal 160a which is also applied to the control terminal 162c of transistor 162. Transistor 160 functions in a manner similar to transistor 134 (FIG. 8). Transistors 158, 160 and 162 are interconnected to form a node B. Transistors 154 and 156 are interconnected to form a node C. The output of buffer inverter logic device 150 is generated at terminal 162b of transistor 162. Transistor 162 couples its output to the next logic stage at a C2 clock pulse.

Buffer inverter logic device 150 essentially performs the same function as half bit of signal delay logic device 24 (FIG. 1); however, it has increased clock loading because the charge required to charge the output capacitance is furnished by a C2 clock phase, whereas in half bit of signal delay logic device 24, if transistor 30 is interconnected to the positive voltage supply, the charge needed to pull up node C is obtained through the positive supply itself. Buffer inverter logic device 150, however, is only limited by the drive capabilities of clock phase C2 and can drive larger capacitive loads because charge sharing between nodes A and C (FIG. 1) is not involved in buffer inverter logic device 150.

In the operation of buffer inverter logic device 150, if the input logic signal is low during a C1 clock phase, node A precharges to a threshold below the positive supply voltage, V. During clock phase C2, transistor 160 acts as a gated clock device as illustrated in FIG. 8. The entire channel capacitance of transistor 160 contributes to bootstrapping of node A. Node B follows clock phase C2 in rising high and transistor 162 couples the logic level of node B to the next succeeding logic stage at its output terminal 162b. In buffer inverter logic device 150, all charges are applied from clock phase C2 rather than through the charge sharing scheme of node A (FIG. 1). In the case where the logic input was a low, the output rises with clock phase C2 to a high level thereby providing the inverting function of buffer inverter logic device 150. If, on the other hand, the logic input was a high level, during clock phase C2, node A which had been previously precharged during clock phase C1 will discharge. Node B will then discharge since transistor 158 is turned on during clock phase C2. Also on during clock phase C2 is transistor 162 to provide a logic low output.

In summary, buffer inverter logic device 150 performs the inversion function of half bit of signal delay 24 (FIG. 1) but is capable of driving a larger capacitive load than signal delay logic device 20 (FIG. 1) because it does not depend on charge sharing for its operation. All charges are provided by clock phase C2. Although buffer inverter logic device 150 is shown as a clock phase C2 inverter, an identical buffer inverter can be provided for clock phase C1 operations by interchanging the clock phase C1 and clock phase C2 connections. Buffer inverter logic device 150 may also be constructed to include additional transistors to perform complicated logic functions by interconnecting serial transistors or parallel transistors to replace transistor 156 between node C and ground potential as illustrated in FIGS. 3, 4 and 5.

Figure 10:
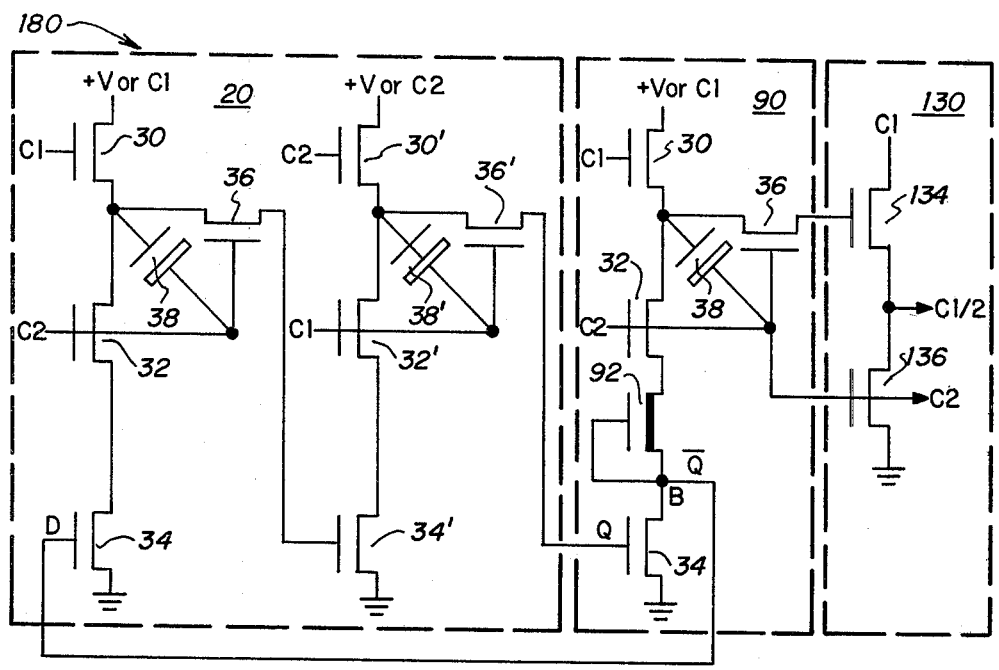
FIG. 10 is a logic circuit schematic diagram illustrating a divide-by-two logic device utilizing the present one bit of signal delay, half bit of signal delay and gated clock logic devices of the present invention.

Referring to FIG. 10, a divide-by-two logic device generally identified by the numeral 180 is illustrated utilizing the present one bit of signal delay logic device 20 (FIG. 1), half bit of signal delay 90a (FIG. 6) and gated clock logic device 130 (FIG. 8). One bit of signal delay logic device 20 and half bit of signal delay logic device 90a are interconnected in a three inverter stage feedback loop analogous to a D flip-flop where the $\overline{Q}$ output at node B of depletion transistor 92 is applied to the input of transistor 34 as a D input of a divide-by-two flip-flop. The feedback loop is possible in that a two phase ratioless scheme is utilized in accordance with the present invention wherein half bit signal delay 90a is utilized to perform two levels of inversion to occur in a single half bit time. Gated clock logic device 130 can also be interconnected to any of the three inverter stages with the same result being to enable divide-by-two logic device 180 to gate every other clock phase to drive a subsequent logic device.

Figure 11:
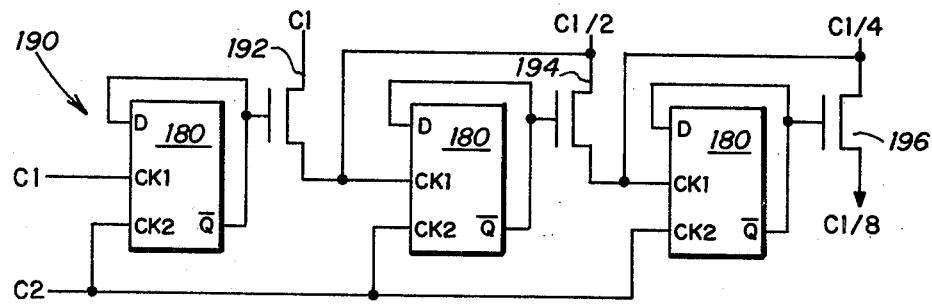
FIG. 11 is a logic circuit schematic diagram illustrating a binary divide-by-eight logic device utilizing the present logic devices.

FIG. 11 illustrates a binary divide-by-eight logic device generally identified by the number 190 which incorporates three stages of divide-by-two logic device 180 (FIG. 10). Each divide-by-two logic device 180 is represented symbolically as a D flip-flop whose $\overline{Q}$ output is connected to its D input. Divide-by-two logic devices 180 are interconnected in a cascade fashion to perform a divide-by-eight function. Each stage provides full power supply level clocks for the next succeeding stage. Clock phase C2 has been shared with all three stages while clock phase C1 has been sequentially gated. The first stage gates every other clock phase C1, the second stage gates every fourth clock phase C1, while the final stage gates every eighth clock phase C1. The three phases are interconnected using transistors 192 and 194 to provide an output of the C1 clock phase divided-by-eight at transistor 196. The binary divide-by-eight logic device 190 is driven only by clock phases C1 and C2.

Figure 12:
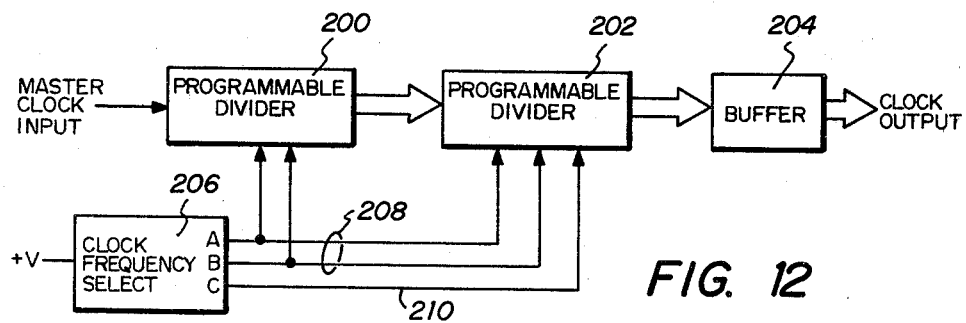
FIG. 12 is a block diagram of a programmable clock divide system utilizing the present logic devices.

FIG. 12 illustrates a further use of the present invention combining numerous divide logic devices to structure a programmable clock divider. Such a programmable clock divider is utilized in pulse-code modulation telecommunication systems to provide necessary clock signals for operation of filter networks. As shown in FIG. 12, a programmable divider 200 is driven by a master clock input. Programmable divider 200 may comprise divide-by-two logic devices 180 whose output is applied to a programmable divider 202. Programmable divider 202 may provide for divide-by-three or divide-by-four or divide-by-five or divide-by-eight divide ratios and include numerous logic devices 20, 90 and 130. The output of programmable divider 202 is buffered using a bootstrap clock buffer 204 to generate a clock output for other functions. A clock frequency select circuit 206 driven by a DC input voltage source to control the clock divide ratio provides outputs along signal lines 208 and 210 to programmable dividers 200 and 202 to control the length of the divide ratio.

It therefore can be seen that the present invention provides for dynamic ratioless circuitry for use in numerous random logic circuit applications. The logic devices of the present invention provide for low power dissipation while utilizing small geometry devices. Although charge sharing between logic output and input capacitances are present, this effect is minimal due to the bootstrap action of the present invention to preserve the logic level voltage. In one aspect of the present invention, charge sharing is eliminated. The present invention further provides for logic circuitry in which half bit of signal delay logic devices are utilized to allow odd numbers of inversion stages to be incorporated in feedback loops of random logic circuits. Additionally, the present invention provides for the use of logic outputs as full supply voltage clocks using a bootstrapped gate drive.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A logic circuit for receiving an input signal and for generating a delayed output signal being clocked by first and second non-overlapping clock phases comprising:

voltage supply means;

precharge transistor means interconnected to said voltage supply means and being clocked by the first clock phase;

discharge transistor means interconnected to said precharge transistor means thereby defining a first node and being clocked by the second clock phase to conditionally discharge said first node, said precharge transistor during the first clock phase precharges said first node;

input logic means interconnected to said discharge transistor means thereby defining a second node for providing a discharge path from said first node to a ground voltage potential, said input logic means connected to receive the input signal;

output transistor means interconnected to said first node for generating the delayed output signal, said output transistor means being clocked by the second clock phase;

capacitor means interconnected to said first node and said output transistor means and being clocked by the second clock phase for maintaining said first node at a predetermined voltage level by a bootstrapping operation; and resistor means interconnected between said discharge transistor means and said second node for limiting current flow through said discharge transistor means.

2. The logic circuit of claim 1 wherein said voltage supply means comprises the first clock phase.

3. A logic circuit for receiving an input signal and for generating a delayed output signal being clocked by first and second non-overlapping clock phases comprising:

voltage supply means;

precharge transistor means having first and second terminals and a control terminal, said first terminal being interconnected to said voltage supply means and said control terminal interconnected to receive the first clock phase;

discharge transistor means having first and second terminals and a control terminal, said first terminal being interconnected to said first terminal of said precharge transistor means to define a first node and said control terminal being interconnected to receive the second clock phase;

input transistor means having first and second terminals and a control terminal, said first terminal being interconnected to said second terminal of said discharge transistor means to define a second node and said control terminal interconnected to receive the input signal for providing a discharge path for said first node to a ground voltage potential;

output transistor means having first and second terminals and a control terminal, said first terminal being interconnected to said first node, the output signal being generated at said second terminal and said control terminal interconnected to receive the second clock phase;

capacitor means having first and second terminals, said first terminal being interconnected to said first node and said second terminal being connected to receive the second clock phase for maintaining said first node at a predetermined voltage level by a bootstrapping operation; and resistor means having first and second terminals, said first terminal being interconnected to said second terminal of said discharge transistor means and said second terminal being interconnected to said first terminal of said input transistor means.

4. The logic circuit of claim 3 wherein said resistor means comprises:
a depletion mode field-effect transistor having gate and source terminals interconnected to form said second terminal of said resistor means.

5. A half bit delay logic device for receiving an input signal and for generating an output signal delayed by one half bit from the input signal and being twice inverted within one clock phase period, the half bit delay logic device receiving first and second non-overlapping clock phases and comprising:

voltage supply means;

first precharge transistor means interconnected to said voltage supply means and being clocked by the first clock phase;

first discharge transistor means interconnected to said first precharge transistor means thereby defining a first node and being clocked by the second clock phase to conditionally discharge said first node;

resistor means interconnected to said first discharge transistor means for limiting current flow through said first discharge transistor means;

first input transistor means interconnected to said resistor means thereby defining a second node for providing a discharge path from said first node to a ground voltage potential, said first input transistor means connected to receive the input signal;

first output transistor means interconnected to said first node for generating a half bit delayed inverted output signal during the second clock phase and being clocked by the second clock phase;

first capacitor means interconnected to said first node and said first output transistor means and being clocked by the second clock phase for maintaining said first node at a predetermined voltage level;

second precharge transistor means interconnected to said voltage supply means and being clocked by the first clock phase;

second discharge transistor means interconnected to said second precharge transistor means thereby defining a third node and being clocked by the second clock phase to conditionally discharge said third node;

second input transistor means interconnected to said second discharge transistor means for providing a discharge path from said third node to said ground voltage potential, said second input transistor means connected to said second node;

second output transistor means interconnected to said third node for generating a half bit delayed inverted output signal during the second clock phase and being clocked by the second clock phase; and second capacitor means interconnected to said third node and said second output transistor means and being clocked by the second clock phase for maintaining said third node at a predetermined voltage level.

6. A buffer inverter logic circuit for receiving an input signal and for generating a delayed output signal for outputting to succeeding interconnected logic circuits, the buffer inverter logic circuit being clocked by first and second non-overlapping clock phases and comprising:

voltage supply means;

precharge transistors means interconnected to said voltage supply means and being clocked by the first clock phase;

discharge transistor means interconnected to said precharge transistor means thereby defining a first node and being clocked by the second clock phase to conditionally discharge said first node;

input transistor means interconnected to said discharge transistor means for providing a discharge path from said first node to a ground voltage potential, said input transistor means connected to receive the input signal;

first transistor means interconnected to said first node being maintained active by bootstrap action, said first transistor means being clocked by the second clock phase;

output transistor means interconnected to said first transistor means for generating the delayed output signal and being clocked by the second clock phase; and second transistor means interconnected to said first node for providing a discharge path for said output signal, said second transistor means being clocked by the second clock phase.

7. A logic circuit clock divider being clocked by first and second non-overlapping clock phases for generating divided first and second clock phase comprising:

voltage supply means;

first precharge transistor means interconnected to said voltage supply means and being clocked by the first clock phase;

first discharge transistor means interconnected to said first precharge transistor means thereby defining a first node and being clocked by the second clock phase to conditionally discharge said first node;

first input transistor means interconnected to said first discharge transistor means for providing a discharge path from said first node to a ground voltage potential;

first output transistor means interconnected to said first node for generating a half bit delayed inverted output signal during the second clock phase and being clocked by the second clock phase;

first capacitor means interconnected to said first node and said first output transistor means and being clocked by the second clock phase for maintaining said first node at a predetermined voltage level;

second precharge transistor means interconnected to said voltage supply means and being clocked by the second clock phase;

second discharge transistor means interconnected to said second precharge transistor means thereby defining a second node and being clocked by the first clock phase to conditionally discharge said second node;

second input transistor means interconnected to said second discharge transistor means for providing a discharge path from said second node to said ground voltage potential, said second input transistor means connected to receive said half bit delayed output signal from said first output transistor means;

second output transistor means interconnected to said second node for generating a one bit delayed output signal during the first clock phase and being inverted from said half bit delayed inverted output signal and being clocked by the first clock phase;

second capacitor means interconnected to second node and said second output transistor means and being clocked by the first clock phase for maintaining said second node at a predetermined voltage level;

third precharge transistor means interconnected to said voltage supply means and being clocked by the first clock phase;

third discharge transistor means interconnected to said third precharge transistor means thereby defining a third node and being clocked by the second clock phase to conditionally discharge said third node;

resistor means interconnected to said third discharge transistor means;

third input transistor means interconnected to said resistor means thereby defining a fourth node for providing a discharge path from said third node to said ground voltage potential, said third input transistor means connected to receive the output of said second output transistor means;

said fourth node being interconnected to provide a feedback path to said first input transistor;

third output transistor means interconnected to said third node for generating a half bit delayed inverted output signal during the second clock phase and being clocked by the second clock phase;

third capacitor means interconnected to said third node and said third output transistor means and being clocked by the second clock phase for maintaining said third node at a predetermined voltage level;

fourth input transistor means for receiving the output signal of said third output transistor means and the first clock phase, and transistor means interconnected to said fourth input transistor means thereby defining a fifth node, said second transistor means connected to receive the second clock phase to provide a divided output clock signal at said fifth node to a succeeding logic block upon receiving the second clock phase, said transistor means maintaining a predetermined charge on said fifth node.

* * * * *